US008684191B2

(12) United States Patent
Hosey et al.

(10) Patent No.: US 8,684,191 B2
(45) Date of Patent: Apr. 1, 2014

(54) CARD RACK SYSTEM

(75) Inventors: Mark A. Hosey, East Kilbride (GB);
Richard J. Stevens, Tullibody (GB)

(73) Assignee: Honeywell International Inc.,
Morristown, NJ (US)

( * ) Notice: Subject to any disclaimer, the term of this patent is extended or adjusted under 35 U.S.C. 154(b) by 439 days.

(21) Appl. No.: 12/631,366

(22) Filed: Dec. 4, 2009

(65) Prior Publication Data

US 2011/0132852 A1 Jun. 9, 2011

(51) Int. Cl.
*A47G 19/08* (2006.01)

(52) U.S. Cl.
USPC ........................................... 211/41.17

(58) Field of Classification Search
USPC ........ 211/41.1, 41.12, 41.2, 40, 41.17, 41.13, 211/41.14, 41.18, 42; 206/560, 740, 425, 206/449; 361/801, 796, 797; D6/467, 629; D19/90
See application file for complete search history.

(56) References Cited

U.S. PATENT DOCUMENTS

| 601,753 | A | * | 4/1898 | Kaiser | 211/41.2 |
| 632,876 | A | * | 9/1899 | Meaker | 211/41.13 |
| 1,006,486 | A | * | 10/1911 | King | 211/41.13 |
| 1,621,327 | A | * | 3/1927 | Lehman | 211/41.1 |
| 1,660,210 | A | * | 2/1928 | Schaefer | 211/41.2 |
| 2,511,730 | A | * | 6/1950 | McClain | 211/41.13 |
| 2,620,928 | A | * | 12/1952 | Brooks | 211/41.2 |
| D181,235 | S | * | 10/1957 | Smith | D6/571 |
| 2,873,859 | A | * | 2/1959 | Gates | 211/41.1 |
| 2,989,189 | A | * | 6/1961 | Leone | 211/41.1 |
| D199,423 | S | * | 10/1964 | Probst | D6/467 |
| 3,200,957 | A | * | 8/1965 | Morin | 211/1 |
| 3,282,437 | A | * | 11/1966 | Hansen | 211/41.7 |
| 3,907,116 | A | * | 9/1975 | Wolf et al. | 211/40 |
| 4,307,809 | A | * | 12/1981 | Haswell | 211/40 |
| 4,518,085 | A | * | 5/1985 | Chisholm et al. | 206/454 |
| D281,209 | S | * | 11/1985 | Burns | D6/468 |
| 4,566,839 | A | * | 1/1986 | Butler | 414/404 |
| 4,592,471 | A | * | 6/1986 | Bross | 211/41.2 |
| 4,629,067 | A | * | 12/1986 | Pavlik et al. | 206/425 |
| 4,729,479 | A | * | 3/1988 | Wallin | 211/40 |
| 4,781,423 | A | * | 11/1988 | Muenzer et al. | 312/183 |
| D315,746 | S | * | 3/1991 | Christensen | D19/90 |
| 5,215,198 | A | * | 6/1993 | Sutton | 211/40 |
| 5,333,741 | A | * | 8/1994 | Yang | 211/40 |
| 5,794,796 | A | * | 8/1998 | Weisburn | 211/40 |
| D405,115 | S | * | 2/1999 | Stravitz | D19/90 |
| 5,921,404 | A | * | 7/1999 | Cooke et al. | 211/40 |
| 6,279,757 | B1 | * | 8/2001 | Hayoun | 211/40 |
| D509,982 | S | * | 9/2005 | Yang | D6/629 |
| 7,341,151 | B2 | * | 3/2008 | Takagi | 206/454 |
| 2002/0084232 | A1 | * | 7/2002 | Yang | 211/41.1 |
| 2003/0019825 | A1 | * | 1/2003 | de Rouvray | 211/40 |
| 2004/0022607 | A1 | * | 2/2004 | Lim et al. | 414/222.01 |
| 2004/0065629 | A1 | * | 4/2004 | Hunt et al. | 211/40 |
| 2007/0125726 | A1 | * | 6/2007 | Seo | 211/41.18 |

\* cited by examiner

*Primary Examiner* — Jonathan Liu
*Assistant Examiner* — Patrick Hawn
(74) *Attorney, Agent, or Firm* — Husch Blackwell LLP

(57) ABSTRACT

A support rack for a substantially planar circuit board includes first and second spaced apart sides. The sides define a plurality of spaced apart product receiving support surfaces where corresponding surfaces on each side are parallel to one another and spaced apart by a central region to form a U-shaped rack. Between pairs of support surfaces on a selected side are truncated, trapezoidal-like protrusions which terminate in product retaining clips. Integrally formed braces can be provided to increase rack strength.

4 Claims, 12 Drawing Sheets

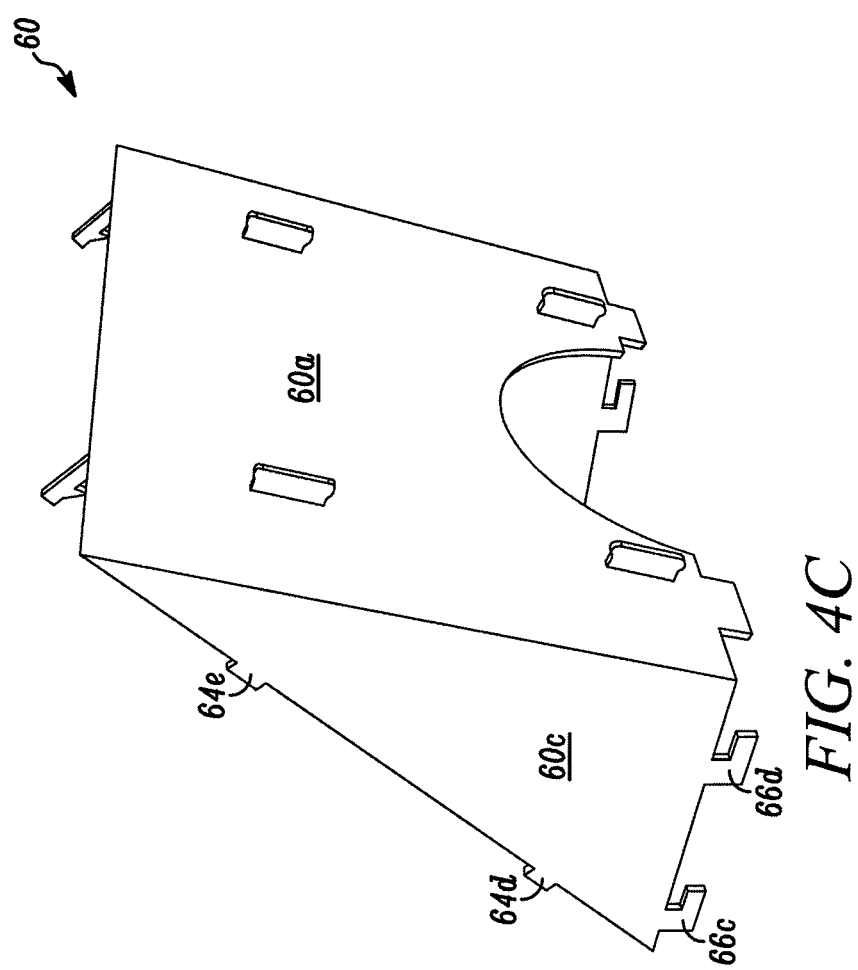

US 8,684,191 B2

CARD RACK SYSTEM

FIELD

The invention pertains to racks for supporting products. More particularly, the invention pertains to racks usable to support cards implemented as component carrying printed circuit boards.

BACKGROUND

Card rack systems have wide application where component carrying cards must be mounted in close proximity to one another, especially printed circuit boards in the electronics industry. It has been recognized that the process of mounting cards, for example printed circuit boards (PCBs), in enclosures presents a number of problems. Card rack systems stack the cards in a manner that leaves key components on the boards inaccessible to installation, maintenance and repair personnel.

Card rack systems are multi-component assemblies and therefore substantially more expensive than other methods of mounting cards in an enclosure. Also, fitting a traditional card rack system in the enclosure requires a number of additional fasteners which require labor intensive techniques to assemble and install.

Other methods of mounting cards in an enclosure usually require multiple components that must be fitted to the enclosure by labor intensive means. Known card mounting systems that provide easy access for installation, maintenance and repair personnel are often wasteful of space, i.e. they require a larger more expensive enclosure.

BRIEF DESCRIPTION OF THE DRAWINGS

FIG. 4C is an isometric view of the rack of FIG. 4A from a different direction;

DETAILED DESCRIPTION

Figure 1:
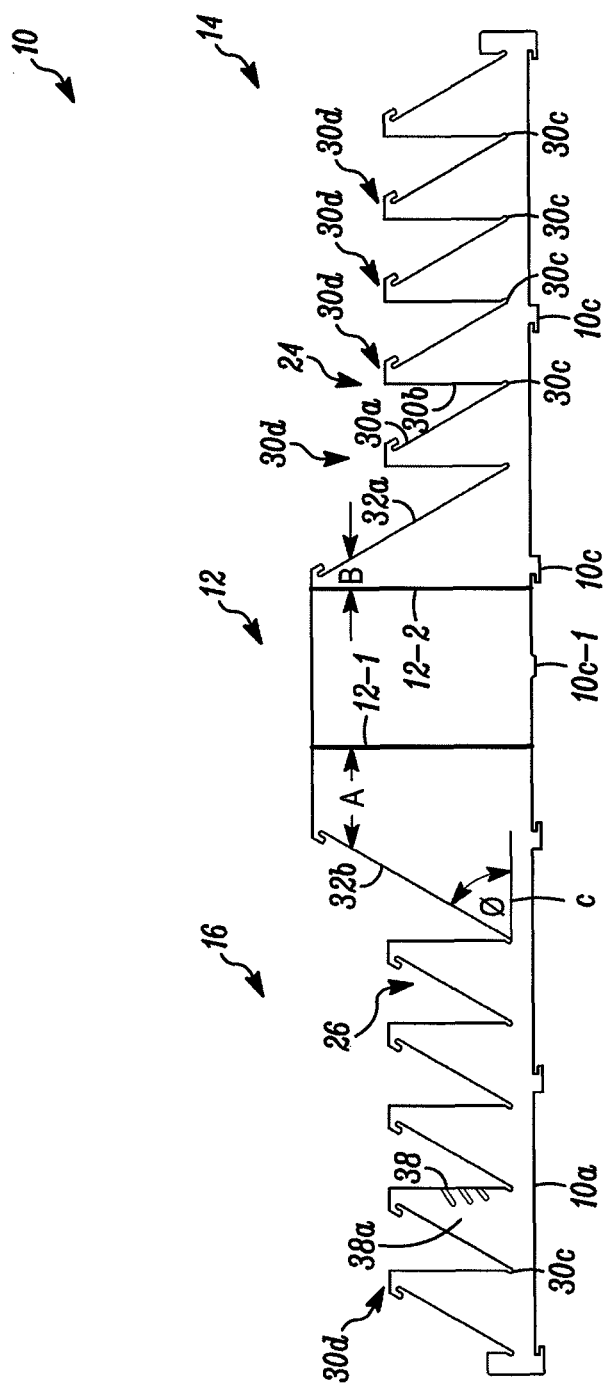
FIG. 1 is a planar representation of a product support rack in accordance with the invention.

While embodiments of this invention can take many different forms, specific embodiments thereof are shown in the drawings and will be described herein in detail with the understanding that the present disclosure is to be considered as an exemplification of the principles of the invention, as well as the best mode of practicing same, and is not intended to limit the invention to the specific embodiment illustrated.

Card rack systems which embody the present invention can be implemented for mass production as a single structure which can be stamped out of an appropriate non-conducting material. Advantageously, such structures can be very inexpensive and have a simple, easy to manufacture shape.

Card rack systems which embody the present invention have the potential to meet all the design requirements presently offered by much more expensive traditional designs of card rack systems. Advantageously, the enclosures in which card racks in accordance with the invention are to be mounted require no additional fittings, which are expensive and labor intensive to install. Instead, only holes and apertures or cut relief pressings molded or stamped out on the enclosure at time of manufacture are required.

Card rack systems which embody the present invention can be installed in an enclosure using a snap fit, or press fit, locking mechanism. As discussed subsequently. such configurations enable a rack to be installed in its enclosure by an automated, mechanized process for high volume production. Alternately, the same design permits a simple manual installation procedure to be executed in seconds.

In an aspect of the invention, such rack systems, when constructed from appropriate material are rigid enough to withstand industry standard drop and shock tests. In yet another aspect of the invention, additional strength can be imparted to such rack designs without detracting from or adding to the associated manufacturing complexity. The final shape may be more complex requiring more folds but the construction of a two dimensional blank that can be folded into a strong three dimensional rack is easily achievable. Also, in embodiments of the invention, access can be provided to a high percentage of each installed card's surface area whist stacking the boards neatly in an efficient space.

Those of skill in the art will understand that the subsequently discussed exemplary embodiments are illustrative only. Other embodiments, or applications, come within the spirit and scope of the invention.

For instance, embodiments of the invention can be designed and implemented for right handed, left handed or ambidextrous personnel; the board surface area and maximum concealed board mounted component height that can be easily accessed by personnel can be set by the choice of compound mounting angles and board separation distances; hook and/or clip design for secure mounting of the boards to the rack must be incorporated; hooks and securing points to provide the means of securing boards to the rack during transit can be incorporated where an elastic band may be stretched between two hooks over mounted boards; a mixture of board mounting angles can be accommodated in the design.

Racks which embody the invention can be represented as a two dimensional structure. A die can then be constructed to stamp/guillotine/cut out the shape from a sheet of appropriate material. Such processes result in relatively simple means of mass production.

In yet another aspect of the invention, the die could also be designed to form weakened fold lines that allow the cut shape to be folded along appropriate lines to create a three dimensional card rack which is ready for installation in its enclosure.

Such embodiments can be designed with an appropriate number of lugs on the lower edge of the rack which fit into and then slide along slotted apertures in an enclosure. A central lug can be implemented as a locking lug which clicks into a slotted aperture in the enclosure when the other lugs are slid into their final position. This locks the rack in position preventing it from moving.

Other possible mounting geometries also come within the spirit and scope of the invention. One such mounts the rack on cut relief pressings in the enclosure. Such a design would have the advantage of shrouding the card rack mounting lugs that would otherwise protrude from the rear of the enclosure.

In disclosed embodiments, the cards can be installed along the hypotenuse of triangular cut outs which are set, preferably, at 60 degrees to the horizontal. The cards can be slotted at their fixing point to the rack to prevent lateral movement. The lower card slots fit into the lower angled corner of the triangular cut outs. The upper slots of the card are pushed into place, resting on the hypotenuse, by clicking them into the press fit fasteners at the apex of the triangular cut outs. Press fit fasteners represent one embodiment. Others are possible without departing from the spirit and scope of the invention.

The hypotenuse provides a rigid edge upon which cards can rest providing them with great support over the width of the card. This affords sufficient mechanical support to allow pressure to be applied to the card as often happens when fitting wires to terminal blocks or pressing home connectors on a card, for example a PCB.

If the cards are small and a high level of mechanical support for the cards is not required the die design can include additional slots on the opposites of the triangular cut outs, at appropriate heights and angles, to allow a range of board sizes to be accommodated in each board position.

In yet another aspect of the invention, a card rack can be provided where the cards are angled to provide easy access to key components mounted close to the upper edge (On PCBs connectors and terminals are generally located on the edge of the board). Such designs provide easy access to a single edge on a card. A second board edge can be exposed by applying a compound angle to its mounting orientation. In another aspect of the invention, an arrangement of offset triangular cut-outs can be provided that allows cards to be mounted in line and parallel but at a compound angle to the base of the enclosure, thus exposing board surface area along two edges of each mounted board.

FIG. 1 illustrates a structure 10 which embodies the invention. Structure 10, which can be formed by punching, cutting or the like out of a planar, non-conductive material, for example, a plastic, without limitation can be inexpensively produced with mass production machinery.

Structure 10 includes a generally rectangular central region 12 bounded by first and second spaced apart sides 14, 16. Sides 14, 16 are attached to the central region 12 by portions having width dimensions A, B. Where A is about equal to B in length, the sides 14, 16 can be, as explained below, substantially identical.

Structure 10 includes a body supporting surface 10a which when structure 10 has been installed in a larger enclosure or housing, provides a support surface in contact with the larger enclosure or housing. Lugs 10c, which engage the enclosure or housing, can be integrally formed on structure 10 during the manufacturing process providing very inexpensive attachment features. A snap fit locking lug 10c-1, as explained previously, can be used to lock the structure 10 to the associated enclosure or housing.

Each of the sides 14, 16 defines a plurality of spaced apart triangular product supporting cut outs such as 24, 26. In the embodiment of structure 10, the cut outs 24, 26 are substantially identical. A description of one of them, such as 24 will also describe the others.

Cut out 24 includes a product supporting surface 30a which is spaced from an adjacent surface 30b. The surfaces 30a,b come together at a respective product receiving slot 30c adjacent to the surface 10a. A distal end of the surface 30a carries a product receiving retainer 30d.

The length of the product supporting surface 30a determines the width of the product that can be carried. A surface such as 32a which is longer than the surface 30a can carry a wider product.

Each of the product support surfaces, such as 30a, 32a 32b and the like on a given side 14, or 16 is substantially parallel to the other product support surfaces on that respective side. All such surfaces are oriented at an angle C less than ninety degrees, preferably on the order of sixty degrees, with respect to the support surface 10a.

Supportable product length is established, at least in part, by a width parameter of the central region 12 and associated spaced apart fold lines 12-1, -2 integrally formed in the structure 10. Once punched or cut from the original sheet member, the sides 14, 16 can be folded relative to central section 12 to form a generally U-shaped product support element. It will also be understood that additional slots, such as indicated at 38, can be added to various of the members, such as 38a to accommodate alternate product sizes without departing from the spirit and scope of the invention.

Figure 2A:
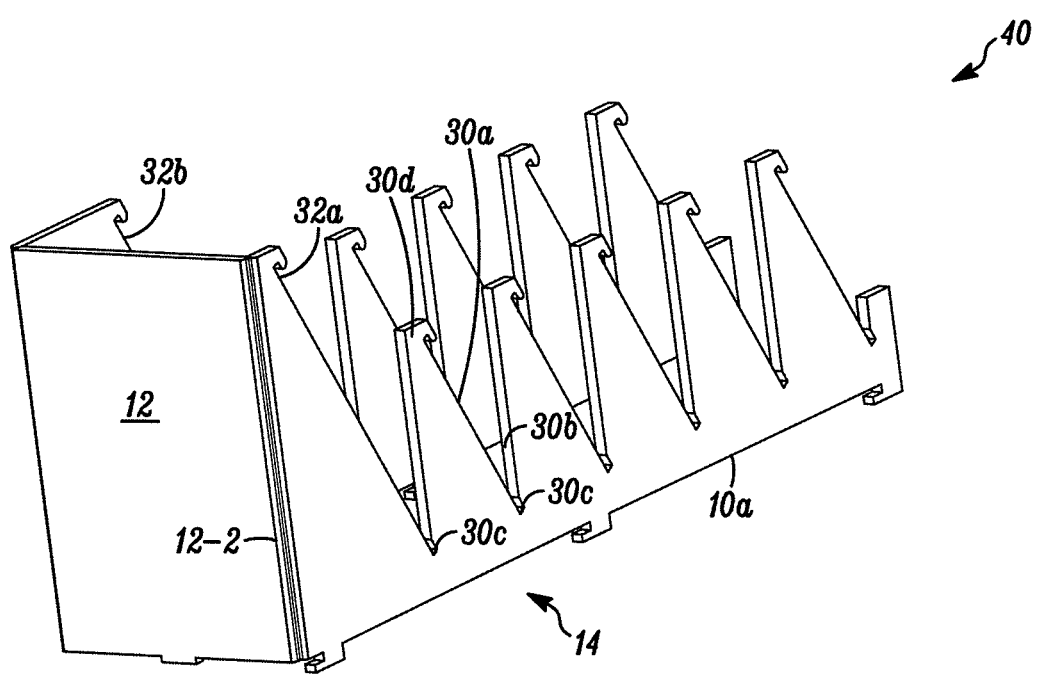
FIG. 2A is an isometric view of the rack of FIG. 1 from a first orientation.
Figure 2B:
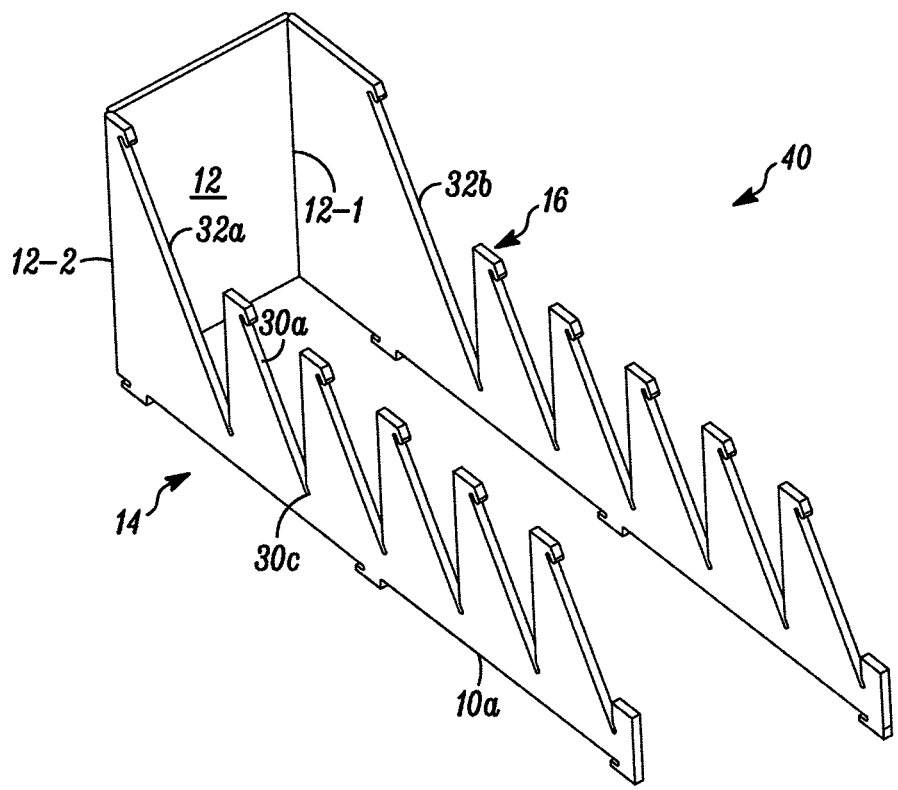
FIG. 2B is an isometric view of the rack of FIG. 1 from a second orientation.
Figure 2C:
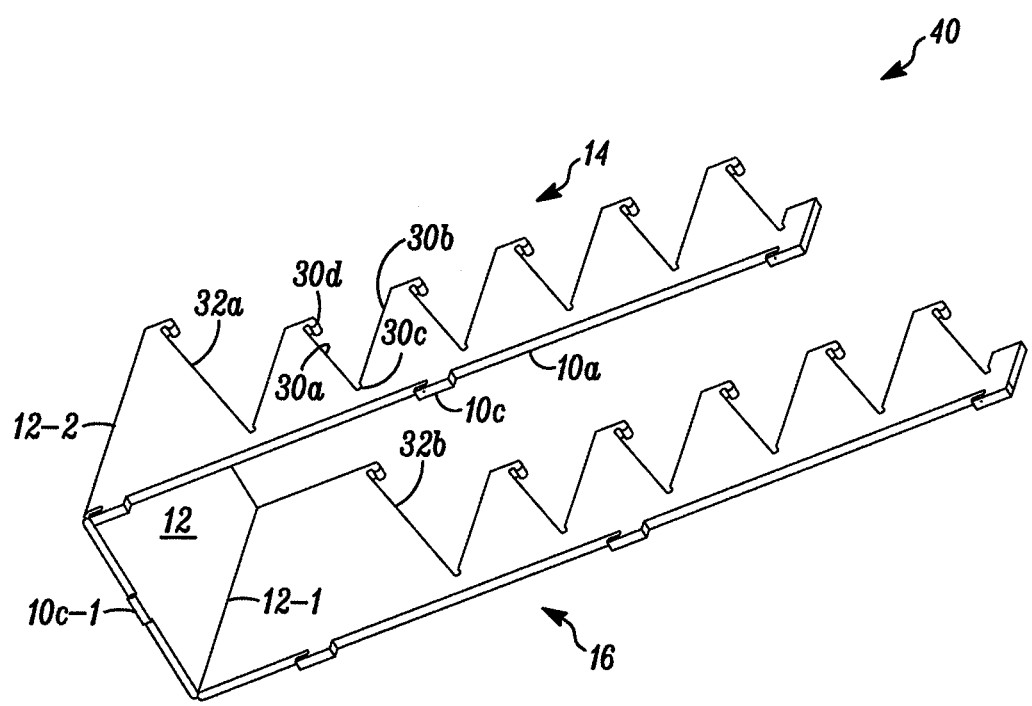
FIG. 2C is an isometric view of the rack of FIG. 1 from a third orientation.

A representative example is illustrated in FIGS. 2A-2C. The folded element 40 can then be installed into an enclosure using lugs 10c and locked thereto using lug 10C-1. Those portions of element 40 previously discussed in connection with FIG. 1 have been assigned the same identification numerals in FIGS. 2A-2C as were used in FIG. 1.

In the element 40, parameter value A is larger than parameter value B, as illustrated in FIG. 1 producing a product orientation offset relative to the central region 12. Where the value of parameter A is substantially equal to parameter B, edges of the products are oriented generally parallel to the central region 12 as illustrated in FIGS. 3A, 3B.

Figure 3A:
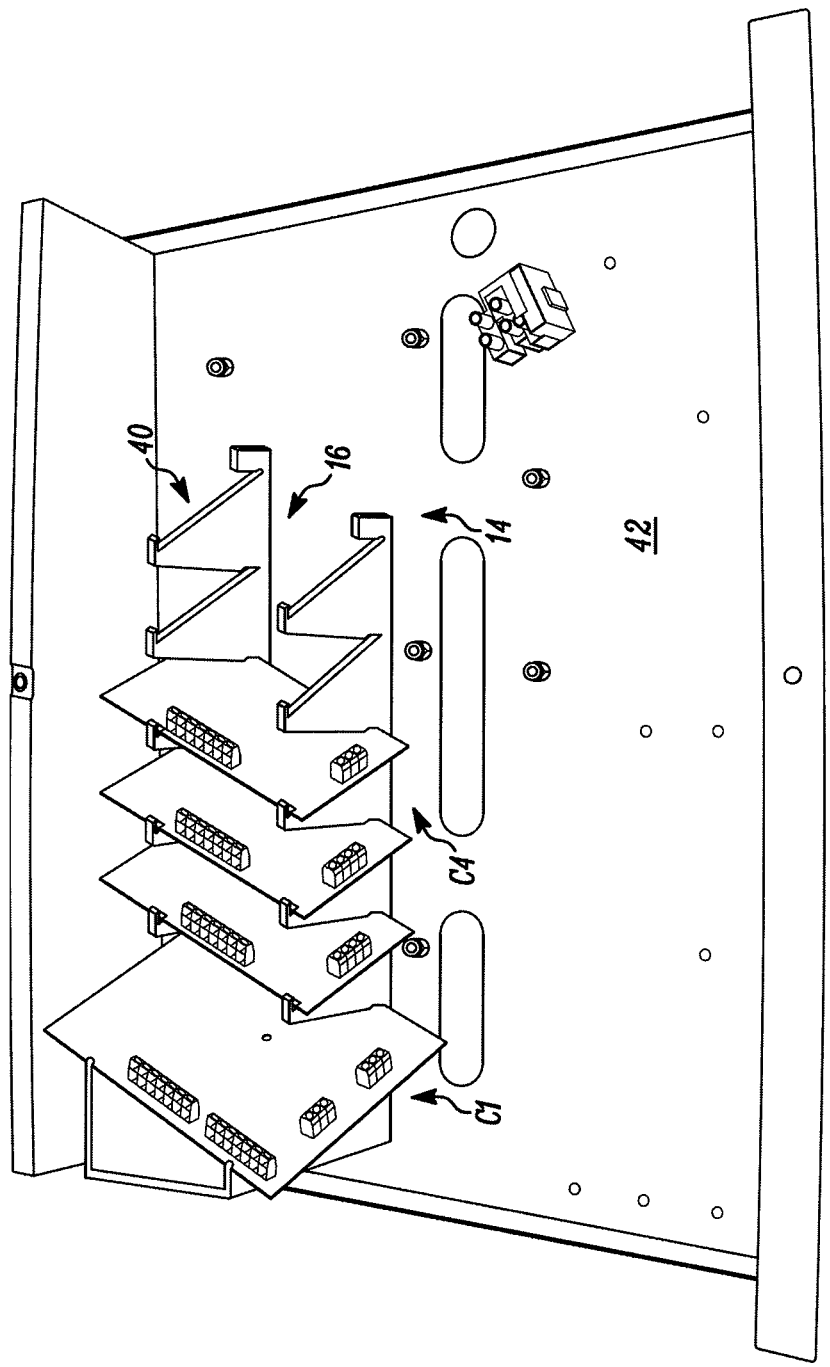
FIG. 3A is a view of the rack of FIG. 1 installed in an enclosure.
Figure 3B:
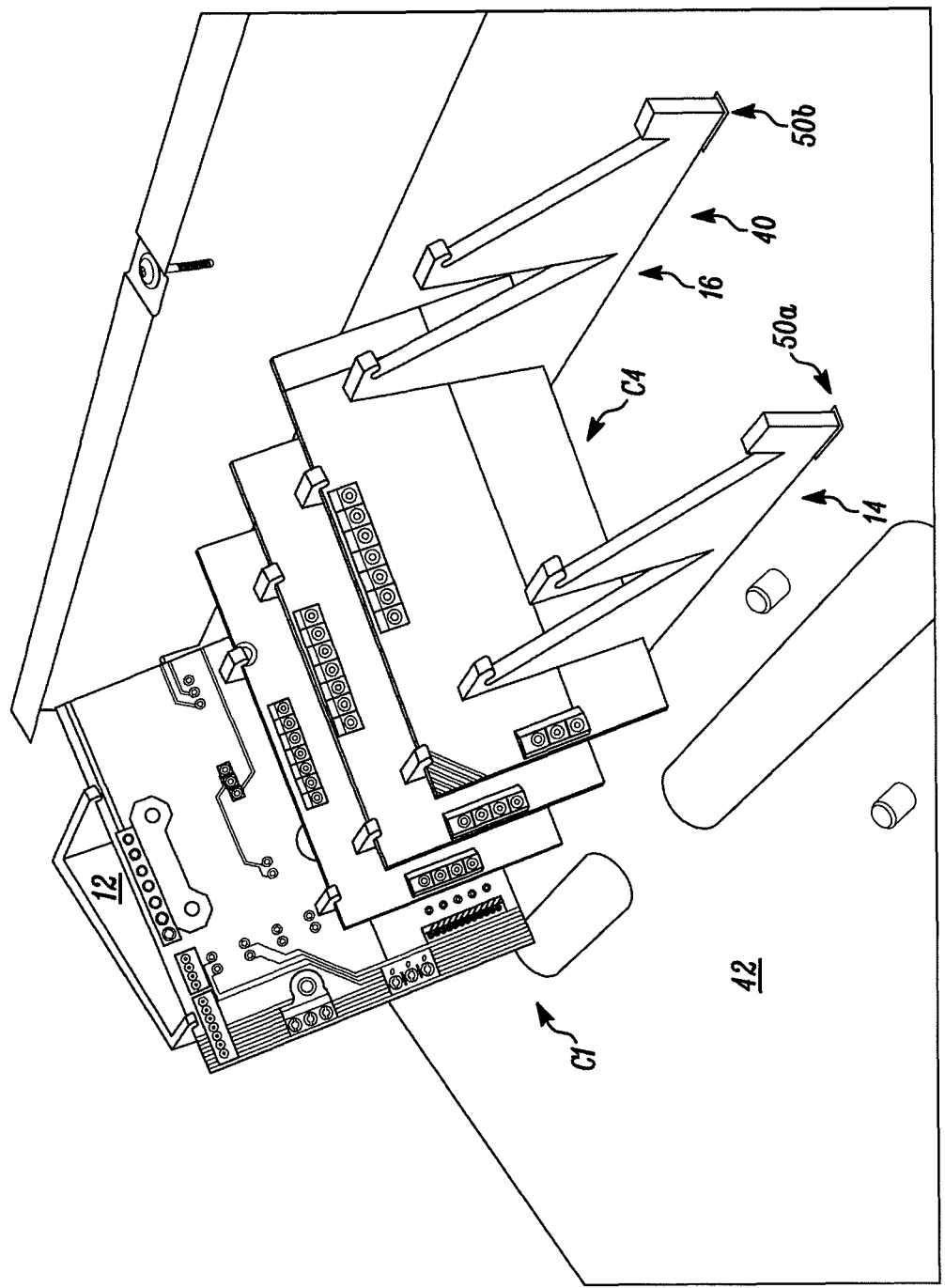
FIG. 3B is an alternate view of the rack of FIG. 1 installed in an enclosure.

As illustrated in FIGS. 3A, 3B product support rack 40 can be used to support a plurality of printed circuit boards, C1, C2, C3 and C4 on respective product support surfaces such as 30a, 32a and 32b. Each of the cards Ci is clamped against the respective product support surfaces by the associated board securing slots, such as slots 30c and board securing clips 30d, best seen in FIG. 1. Because of the difference in parameters A, B the cards Ci exhibit an offset relative to the central region 12.

The card support element 40 is retained in place in housing 42 by the lugs 10c and 10c-1 which engage slots, see slots 50a,b in the enclosure 42. Those of skill will understand that other attachment elements can be used to attach rack 40 to enclosure 42 without departing from the spirit and scope of the invention.

Figure 4A:
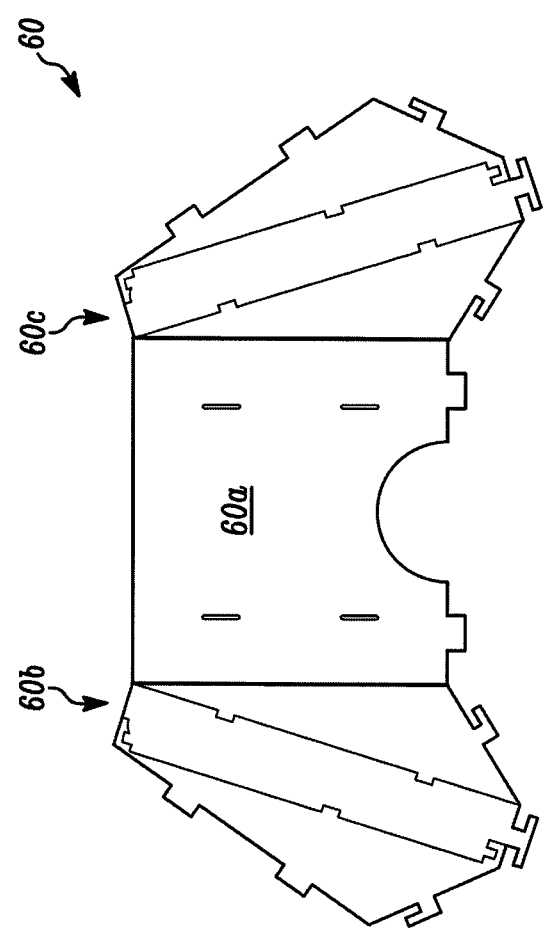
FIG. 4A is a planar representation of a single product support rack in accordance with the invention.
Figure 4B:
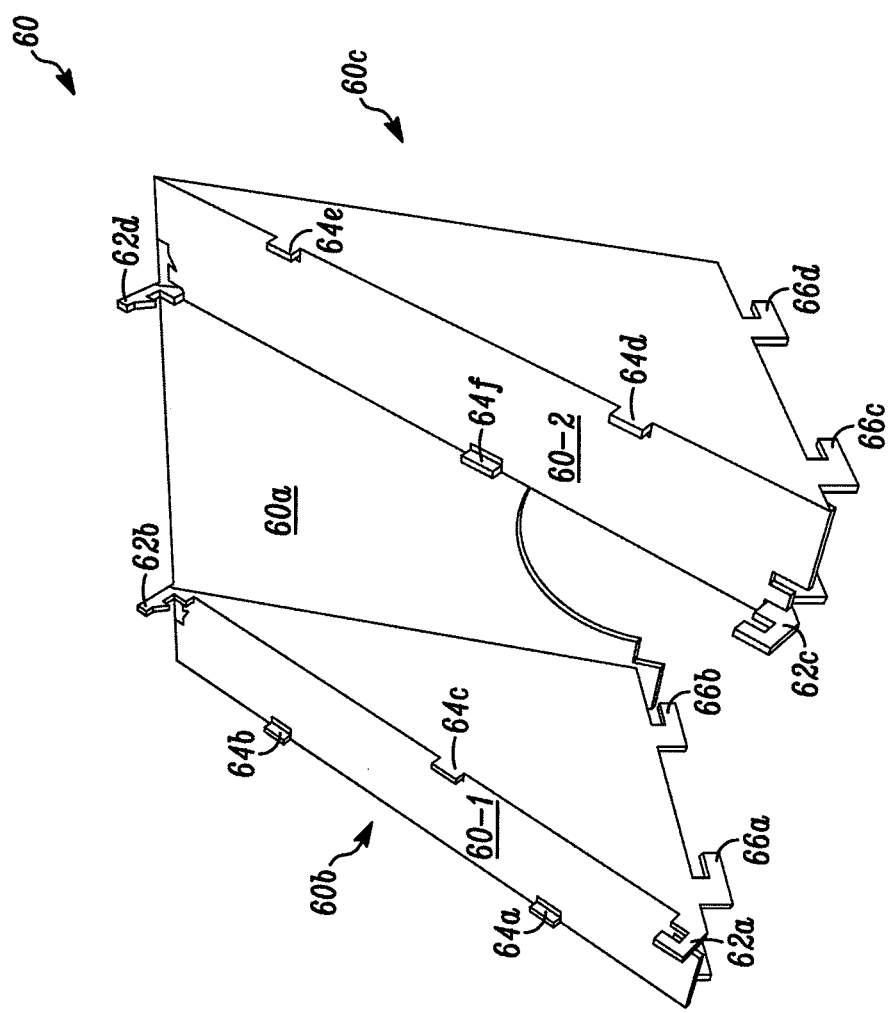
FIG. 4B is an isometric view of the rack of FIG. 4A from a first direction.

It will also be understood that other product support structures come within the spirit and scope of the invention. FIGS. 4A, 4B, and 4C illustrate various views of a reclining single product, or card, holder 60. Unit 60, as illustrated in FIG. 4A is initially formed as a planar two dimensional sheet member which can be punched or cut from a larger sheet member, The planar element 60 can incorporate additional fold lines to define sides 60a, 60b. Product retaining members or clips 62a, 62b . . . 62d can be integrally formed in the sheet member form of product 60 and when folded, see FIGS. 4B, C they will protrude from the adjacent surfaces to engage the respective card or product. Added support elements such as 64a . . . 64d can also be provided. Mounting clips 66a . . . 66d can also be integrally formed, see FIGS. 4B, 4C and will protrude to lock the unit 60 to an enclosure.

Multiple units 60 as in FIG. 4B could be used together if desired as an alternate to the element 40.

Figure 5A:
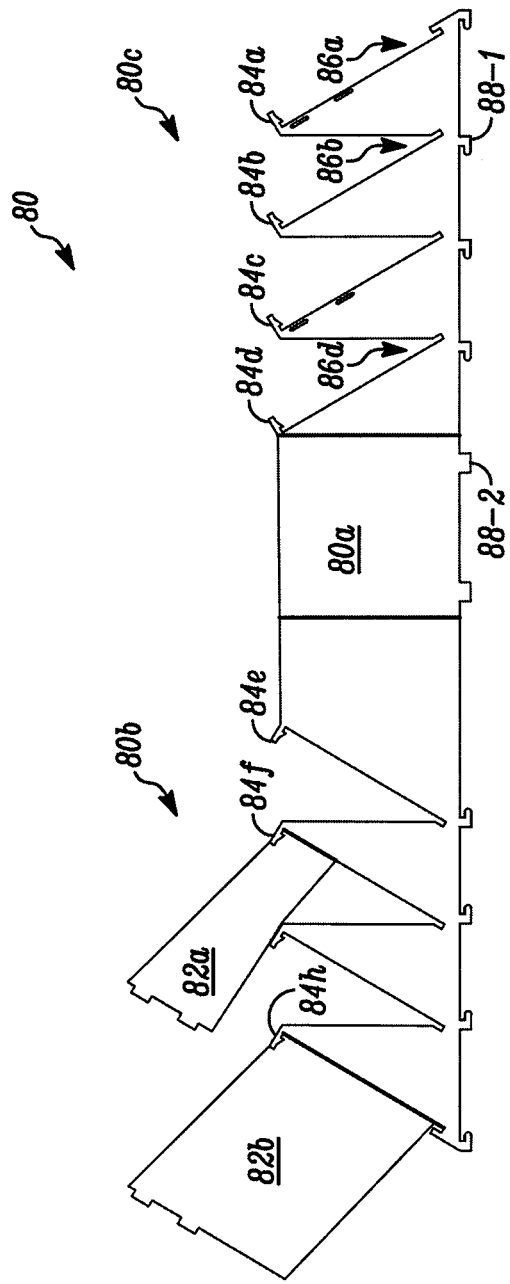
FIG. 5A is a planar representation of yet a multiple product support rack which includes produce braces in accordance with the invention.
Figure 5B:
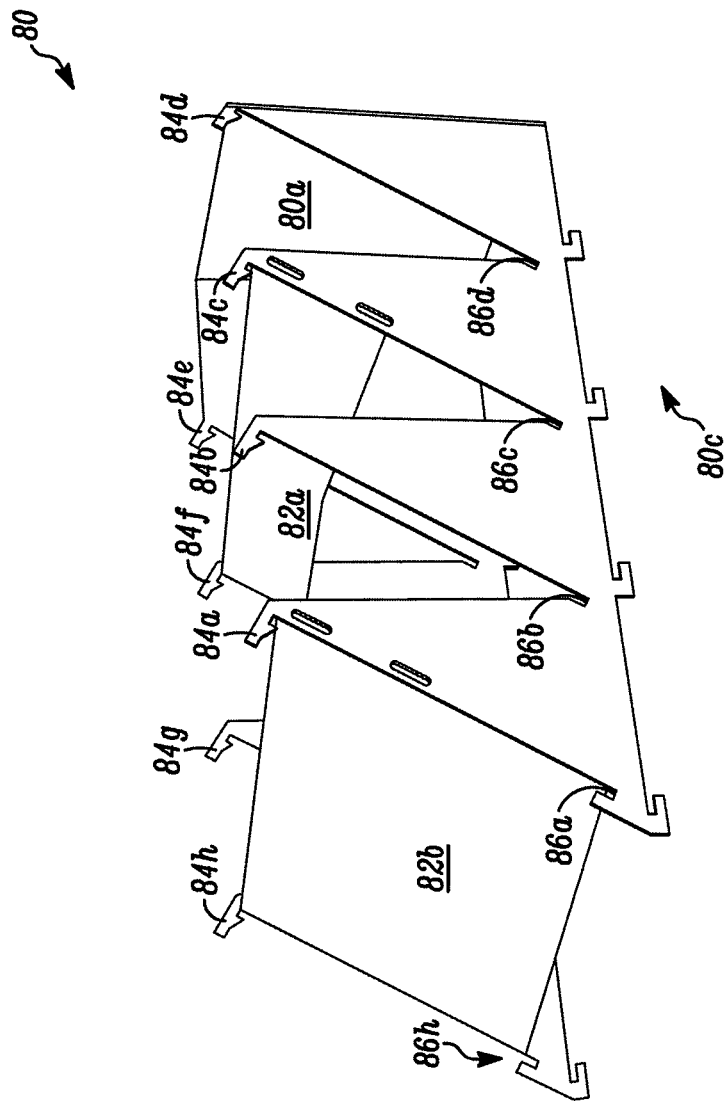
FIG. 5B is an isometric view of the rack of FIG. 5A from a first direction.
Figure 5C:
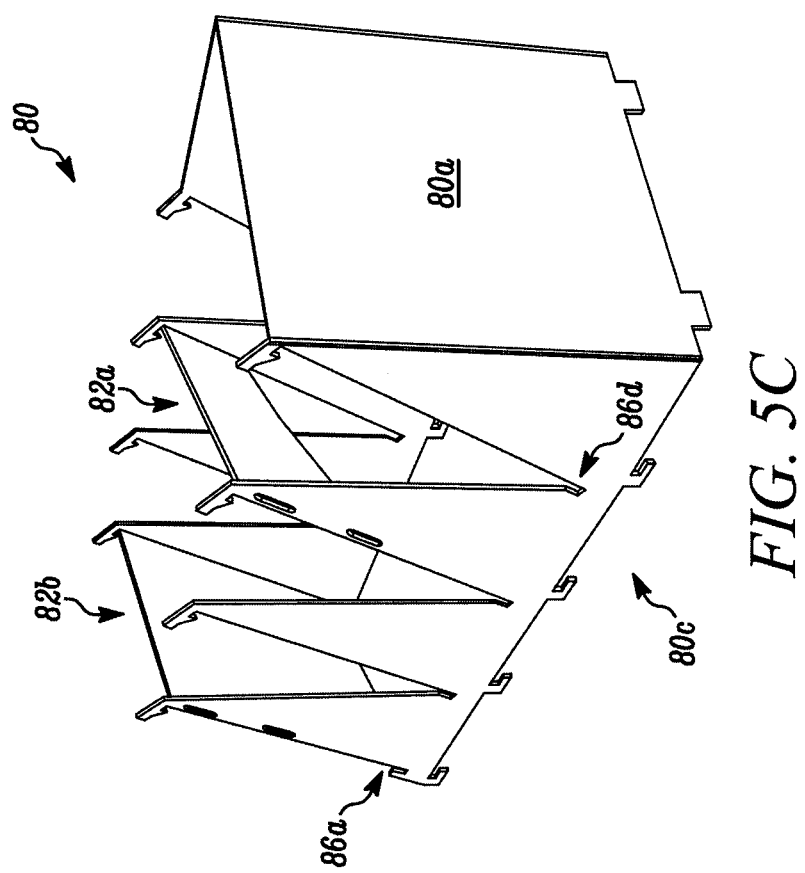
FIG. 5C is an isometric view of the rack of FIG. 5A from a different direction.

FIGS. 5A, 5B, 5C illustrate a multi-product or card rack 80 with additional bracing. Unit 80 can be integrally formed from a planar sheet member with a central section such as 80*a* bounded by two sides 80*b*, 80*c*. Sides 80*b*, 80*c* can be folded relative to the central section 80*a*, as illustrated in FIGS. 5B, 5C, to form a three dimensional card rack having bracing elements 82*a*, 82*b*.

Integrally formed card or product retaining clips, such as 84*a* . . . 84*h* can be combined with displaced slots such as 86*a* . . . 86*h* to provide card, or product, retaining members. Integrally formed clips 88-1 and lugs 88-2 can be provided to mount the unit 80 in an enclosure.

While various of the above noted embodiments have been described in a context of supporting one or more printed circuit boards, or cards, other types of products come within the spirit and scope of the invention. It will also be understood that for any selected rack or product support element, all of the angles that determine the orientation of the product(s) or card(s) can be optimized for product packing density as well as accessibility in accordance with the characteristics of a particular application, or enclosure.

From the foregoing, it will be observed that numerous variations and modifications may be effected without departing from the spirit and scope of the invention. It is to be understood that no limitation with respect to the specific apparatus illustrated herein is intended or should be inferred. It is, of course, intended to cover by the appended claims all such modifications as fall within the scope of the claims.

The invention claimed is:

1. A product support structure comprising:
a substantially flat planar body having a substantially flat central region,
a first side coupled to the substantially flat central region along a first fold line, and
a second side coupled to the substantially flat central region along a second fold line and opposite to the first side so that the two sides, when folded, are perpendicular to the substantially flat central region,
wherein the first side includes a body support surface, at least one product support surface, and at least one adjacent product support surface,
wherein the second side includes a body support surface, at least one product support surface, and at least one adjacent product support surface,
wherein the at least one product support surface being oriented at an angle less than ninety degrees relative to the body support surface and the at least one adjacent product support surface being oriented perpendicular to the body support surface on the first side and on the second side,
wherein the at least one product support surface on the first side and on the second side includes first and second ends,
wherein the at least one adjacent product support surface on the first side and on the second side includes third and fourth ends,
wherein the third and fourth ends of each at least one adjacent product support surfaces terminates in a product retaining clip,
wherein the ends of the at least one product support surface and the at least one adjacent product support surface are displaced from the body support surface on the first side and on the second side ; and
wherein each side and the central region has one or more lugs on their bottom surface.

2. A structure as in claim 1 where the at least one product support surface on the first side and on the second side comprises a plurality of spaced apart, substantially parallel product support surfaces and wherein the at least one adjacent support surface on the first side and on the second side comprises a plurality of spaced apart, substantially parallel adjacent product support surfaces.

3. A structure as in claim 2 where the at least one product support surfaces and at least one adjacent product support surfaces come together and terminate in a product retaining slot on the first side and on the second side.

4. A structure as in claim 3 wherein respective product retaining clips, in combination with respective product retaining slots provide a plurality of spaced apart contact regions for a product.

* * * * *